(12) United States Patent
Plett (10) Patent No.: US 7,656,122 B2
(45) Date of Patent: Feb. 2, 2010

(54) METHOD FOR CALCULATING POWER CAPABILITY OF BATTERY PACKS USING ADVANCED CELL MODEL PREDICTIVE TECHNIQUES

(75) Inventor: Gregory L. Plett, Colorado Springs, CO (US)

(73) Assignee: LG Chem, Ltd. (KR)

( * ) Notice: Subject to any disclaimer, the term of this patent is extended or adjusted under 35 U.S.C. 154(b) by 81 days.

(21) Appl. No.: 11/963,307

(22) Filed: Dec. 21, 2007

(65) Prior Publication Data

US 2008/0094035 A1    Apr. 24, 2008

Related U.S. Application Data

(63) Continuation of application No. 10/811,088, filed on Mar. 25, 2004, now Pat. No. 7,321,220.

(60) Provisional application No. 60/524,326, filed on Nov. 20, 2003.

(51) Int. Cl.
    *H02J 7/00*    (2006.01)
    *H02J 7/16*    (2006.01)
    *H02J 7/04*    (2006.01)

(52) U.S. Cl. .................. 320/128; 320/127; 320/137; 320/149

(58) Field of Classification Search .................. 320/128, 320/116, 132, 127, 137, 148, 156, 157, 162, 320/149
    See application file for complete search history.

(56) References Cited

U.S. PATENT DOCUMENTS

| 5,658,682 | A  | * | 8/1997 | Usuda et al. | .................. 429/92 |
| 7,109,685 | B2 | * | 9/2006 | Tate et al. | .................. 320/132 |
| 2004/0000892 | A1 | * | 1/2004 | Jae-Seung | .................. 320/132 |

* cited by examiner

*Primary Examiner*—Edward Tso
*Assistant Examiner*—Alexis Boateng
(74) *Attorney, Agent, or Firm*—Cantor Colburn LLP (57) ABSTRACT

The present invention relates to a method and an apparatus for estimating discharge and charge power of battery applications, including battery packs used in Hybrid Electric Vehicles (HEV) and Electric Vehicles (EV). One charge/discharge power estimating method incorporates voltage, state-of-charge (SOC), power, and current design constraints and works for a user-specified prediction time horizon $\Delta t$. At least two cell models are used in calculating maximum charge/discharge power based on voltage limits. The first is a simple cell model that uses a Taylor-series expansion to linearize the equation involved. The second is a more complex and accurate model that models cell dynamics in discrete-time state-space form. The cell model can incorporate a inputs such as temperature, resistance, capacity, etc. One advantage of using model-based approach is that the same model may be used in both Kalman-filtering to produce the SOC and the estimation of maximum charge/discharge current based on voltage limits.

5 Claims, 7 Drawing Sheets

METHOD FOR CALCULATING POWER CAPABILITY OF BATTERY PACKS USING ADVANCED CELL MODEL PREDICTIVE TECHNIQUES

CROSS-REFERENCE TO RELATED APPLICATIONS

The present application is a continuation application of U.S. patent application, Ser. No. 10/811,088, filed on Mar. 25, 2004, the contents of which are incorporated herein by reference thereto. U.S. patent application, Ser. No. 10/811,088 claims the benefit of U.S. Provisional Patent Application No. 60/524,326, filed on Nov. 20, 2003, the contents of which are incorporated herein by reference.

BACKGROUND OF THE INVENTION

The present invention relates to the implementation of a method and apparatus for estimating battery charge power and discharge power.

A number of high-performance battery applications require precise real-time estimates of the power available to be sourced by the battery pack. For example, in Hybrid Electric Vehicles (HEVs) and Battery Electric Vehicles (BEVs), the vehicle controller requires continuous up-to-date information from the Battery Management System (BMS) regarding the power that may be supplied to the electric motor from the battery pack, and power that may be supplied to the pack via regenerative braking or by active recharging via the motor. One current technique in the art, called the HPPC (Hybrid Pulse Power Characterization) method, performs this task of estimation by using the voltage limits to calculate the maximum charge and discharge limits. As described in the PNGV (Partnership for New Generation Vehicles) Battery Test Manual, Revision 3, February 2001, published by the Idaho National Engineering and Environmental Laboratory of the U.S. Department of Energy, the HPPC method estimates maximum cell power by considering only operational design limits on voltage. It does not consider design limits on current, power, or the battery state-of-charge (SOC). Also the method produces a crude prediction for horizon $\Delta t$. Each cell in the battery pack is modeled by the approximate relationship $$v_k(t) \approx OCV(z_k(t)) - R \times i_k(t), \quad (1)$$

where $OCV(z_k(t))$ is the open-circuit-voltage of cell k at its present state-of-charge $z_k(t)$ and R is a constant representing the cell's internal resistance. Different values of R may be used for charge and discharge currents, if desired, and are denoted as $R^{chg}$ and $R^{dis}$, respectively.

Since the design limits $v_{min} \leq v_k(t) \leq v_{max}$ must be enforced, the maximum discharge current may be calculated as constrained by voltage, as shown below $$i_{max,k}^{dis,volt} = \frac{OCV(z_k(t)) - v_{min}}{R^{dis}}, \quad (2)$$

The maximum magnitude charge current may be similarly calculated based on voltage. Note, however, that charge current is assumed negative in sign by convention employed in the present invention (although the opposite convention may be used with minor modifications to the method), so that maximum-magnitude current is a minimum in the signed sense. It is $$i_{min,k}^{chg,volt} = \frac{OCV(z_k(t)) - v_{max}}{R^{chg}}, \quad (3)$$

Pack power is then calculated as $$P_{min}^{chg} = n_s n_p \max_k \left( v_{max} i_{min,k}^{chg,volt} \right)$$

$$P_{max}^{dis} = n_s n_p \min_k \left( v_{min} i_{max,k}^{dis,volt} \right)$$

This prior art charge calculation method is limited in several respects. First, as noted above, the method does not use operational design limits on SOC, maximum current, or maximum power in the computation. More importantly, the cell model used is too primitive to give precise results. Overly optimistic or pessimistic values could be generated, either posing a safety or battery-health hazard or causing inefficient battery use.

What is desired is a new method and apparatus for battery charge estimation based on a better cell model. Such a cell model would be combined with a maximum-power algorithm that uses the cell model to give better power prediction. The new method would also take in operational design limits such as SOC, current, and power.

SUMMARY OF THE INVENTION

The present invention relates to a method and an apparatus for estimating discharge and charge power of battery applications, including battery packs used in Hybrid Electric Vehicles (HEV) and Electric Vehicles (EV). One embodiment is a charge prediction method that incorporates voltage, state-of-charge, power, and current design constraints, works for a user-specified prediction horizon $\Delta t$, and is more robust and precise than the state of the art. The embodiment has the option of allowing different modeling parameters during battery operation to accommodate highly dynamic batteries used in Hybrid Electric Vehicles (HEV) and Electric Vehicles (EV) where such previous implementations were difficult.

An embodiment of the present invention calculates maximum charge/discharge power by calculating the maximum charge/discharge current using any combination of four primary limits:
1. state-of-charge (SOC) limits
2. voltage limits
3. current limits
4. power limits In one embodiment, the minimum absolute charge/discharge current value from the calculations using state-of-charge (SOC), voltage, and current limits is then chosen to obtain the maximum absolute charge/discharge power. In one embodiment, the maximum absolute charge/discharge power is checked to ensure it is within the power limits. In one embodiment, the maximum absolute charge/discharge power is calculated in a way as to not violate any combination of the limits that may be used.

Prior methods do not use SOC limits in their estimation of maximum charge/discharge power. The present invention incorporates the SOC of the battery cell or battery pack to estimate the maximum charge/discharge current. The estimation explicitly includes a user-defined time horizon $\Delta t$. In one embodiment, the SOC is obtained by using a Kalman filter. The SOC that is produced by Kalman filtering also yields an estimate of the uncertainty value, which can be used in the maximum charge/discharge calculation to yield a confidence level of the maximum charge/discharge current estimate.

Methods of the present invention improve upon prior art estimation of power based on voltage limits. In the present invention, voltage limits are used to calculate the maximum charge/discharge current in a way that includes a user-defined time horizon $\Delta t$. Two primary cell model embodiments are in the present invention for the calculation of maximum charge/discharge power based on voltage limits. The first is a simple cell model that uses a Taylor-series expansion to linearize the equation involved. The second is a more complex and accurate cell model that models cell dynamics in discrete-time state-space form. The cell model can incorporate a variety of inputs such as temperature, resistance, capacity, etc. One advantage of using model-based approach is that the same cell model may be used in both Kalman filtering to produce the SOC and the estimation of maximum charge/discharge current based on voltage limits.

Embodiments of the present invention also include methods of charge estimation based on any combination of the voltage, current, power, or SOC limits described above. For example, charge estimation can be based on voltage limits only, or combined with current limits, SOC limits and/or power limits.

Embodiments of the present invention are directed to a power estimating apparatus that takes in data measurements from the battery such as current, voltage, temperature, and feeding such measurements to an arithmetic circuit, which includes calculation means that performs the calculation methods disclosed in the present invention to estimate the absolute maximum charge or discharge power.

BRIEF DESCRIPTION OF THE DRAWINGS

These and other features, aspects and advantages of the present invention will become better understood with regard to the following description, appended claims and accompanying drawings where:

DETAILED DESCRIPTION OF THE INVENTION

Embodiments of the present invention relate to battery charge estimation for any battery-powered application. In one embodiment, the estimator method and apparatus find the maximum absolute battery charge and/or discharge power (based on present battery pack conditions) that may be maintained for $\Delta t$ seconds without violating pre-set limits on cell voltage, state-of-charge, power, or current.

Figure 1A:
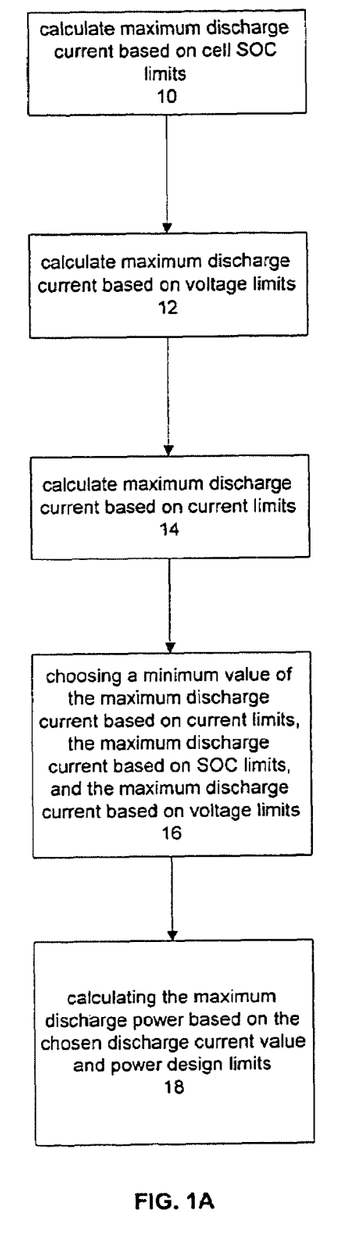
FIG. 1A is a flow chart that outlines the maximum discharge estimation according to an embodiment of the present invention.
Figure 1B:
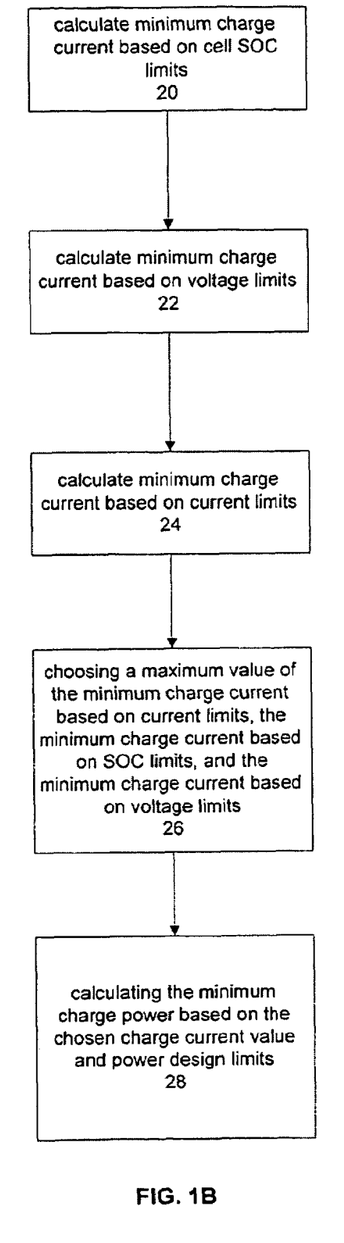
FIG. 1B is a flow chart that outlines the minimum charge estimation according to an embodiment of the present invention.

FIGS. 1A and 1B illustrate an overview of the embodiments of the present invention. FIG. 1A shows a method for finding the maximum discharge power for a user-defined time horizon $\Delta t$, i.e. how much power may be drawn from the battery continuously for use for the next $\Delta t$ time period. In vehicle applications, accurate estimation of maximum discharge power can help prevent the hazardous occurrence of over-drawing the battery.

In step 10, the maximum discharge current is calculated based on pre-set limits on state-of-charge. The estimation explicitly includes a user-defined time horizon $\Delta t$. In one embodiment, the SOC is obtained by using a Kalman filtering method. The SOC that is produced by Kalman filtering also yields an estimate of the uncertainty value, which can be used in the maximum charge/discharge calculation to yield a confidence level of the maximum charge/discharge current estimation. In another embodiment, a simple state-of-charge is used. Step 10 is further described in the section titled "Calculation Based on State-of-Charge (SOC) Limits."

The maximum discharge current is calculated based on pre-set limits on voltage in step 12. The present invention has two main cell model embodiments for the calculation of maximum charge/discharge power based on voltage limits, although it is understood that other cell models could be used. Both overcome the limitation of prior art discharge estimation methods of giving a crude prediction of time horizon $\Delta t$. The first is a simple cell model that uses a Taylor-series expansion to linearize the equation involved. The second is a more complex and accurate cell model that models cell dynamics in discrete-time state-space form. The cell model can incorpo­rate a variety of inputs such as temperature, resistance, capacity, etc. The two cell models are further described in the section titled "Calculation Based on Voltage Limits."

Then in step 14, the maximum discharge current is calculated based on pre-set limits on current. In step 16, the minimum of the three calculated current values from steps 10, 12, and 14 is chosen. It is understood that the execution order of steps 10, 12, 14 is interchangeable. It is further understood that any combination of steps 10, 12, and 14 may be omitted, if desired, in an implementation. Using the chosen discharge current value, step 18 calculates the maximum discharge power. The calculated pack power may be further refined in order to not violate individual cell or battery pack power design limits.

FIG. 1B shows a method for finding the maximum absolute charge power for a user-defined time horizon $\Delta t$, i.e. how much power can be put back into the battery continuously for the next $\Delta t$ time period. The details and progression of the method mirror that of FIG. 1A. Since charge current is considered to have a negative sign, the maximum absolute current is the minimum current in a signed sense. In step 20, the minimum charge current is calculated based on pre-set limits on state-of-charge. Again the SOC can be a simple one or one obtained using the Kalman filtering method. Then the minimum charge current is calculated based on pre-set limits on voltage in step 22 in accordance with a cell model, such as one of the two cell models described in the present disclosure. Then in step 24, the minimum charge current is calculated based on pre-set limits on current. Then, in step 26, the maximum of the three calculated current values from steps 20, 22, and 24 is chosen. Note again that the execution order of steps 20, 22, 24 is interchangeable. It is further understood that any combination of steps 20, 22, 24 may be used and any of the steps 20, 25 22, 24 may be omitted, if desires, in an implementation. Using the chosen charge current value, step 28 calculates the minimum charge power. The calculated pack power may be further refined in order to not violate individual cell or battery pack power design limits.

It is noted that modifications may be made to the method embodiments as shown in FIGS. 1A and 1B. For example, any or all of the current calculation steps based on state-of-charge and voltage limits may be removed. Also, the present invention discloses several methods of calculating maximum absolute charge and discharge current based on state-of-charge, voltage limits, and current limits.

One embodiment of the present invention estimates the maximum absolute charge and/or discharge power of a battery pack. The battery pack may be, for example, a battery pack used in a hybrid electric vehicle or an electric vehicle. The embodiment makes a number of denotations and limits, including:

using n to denote the number of cells in the target battery pack where an estimation of charge and/or discharge power is desired;

using $v_k(t)$ to denote the cell voltage for cell number k in the pack, which has operational design limits so that $v_{min} \leq v_k(t) \leq v_{max}$ must be enforced for all $k: 1 \leq k \leq n$;

using $z_k(t)$ to denote the state-of-charge for cell number k in the pack, which has operational design limits $z_{min} \leq z_k(t) \leq z_{max}$ that must be enforced for all $k: 1 \leq k \leq n$;

using $p_k(t)$ to denote the cell power, which has operational design limits so that $p_{min} \leq p_k(t) \leq p_{max}$ must be enforced for all $k: 1 \leq k \leq n$; and using $i_k(t)$ to denote the cell current, which has operational design limits so that $i_{min} \leq i_k(t) \leq i_{max}$ must be enforced for all $k: 1 \leq k \leq n$.

Modifications can be made in alternate embodiments. For example, any particular limit may be removed if desired by replacing its value by $\pm\infty$, as appropriate. As an another example, limits such as $v_{max}, v_{min}, z_{max}, z_{min}, i_{max}, i_{min}, p_{max}, p_{min}$ may furthermore be functions of temperature and other factors pertaining to the present battery pack operating condition. In one embodiment, it is assumed that the discharge current and power have positive sign and the charge current and power have negative sign. Those skilled in the art will recognize that other sign conventions may be used, and that the description of the present invention can be adapted to these conventions in a forthright manner.

In one embodiment, the model used for predicting charge assumes that the battery pack comprises $n_s$ cell modules connected in series, where each cell module comprises $n_p$ individual cells connected in parallel and $n_s \geq 1$, $n_p \geq 1$ Other configurations are possible and are accommodated by slight modifications to the method as described.

Figure 2:
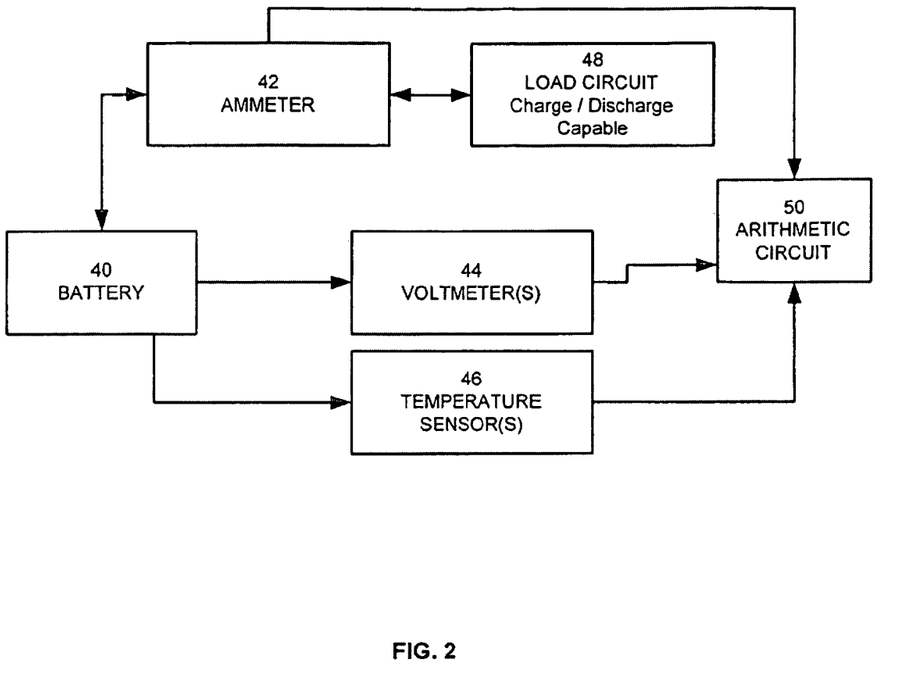
FIG. 2 is a schematic block diagram showing the sensor components of a power estimating embodiment of the present invention.

FIG. 2 is a schematic block diagram showing the sensor components of an embodiment of the present invention. Battery 40 is connected to load circuit 48. For example, load circuit 48 could be a motor in an Electric Vehicle (EV) or Hybrid Electric Vehicle (HEV). In some embodiments circuit 48 is a circuit that provides power and/or draws power. Measurements of battery and individual cell voltages are made with voltmeter(s) 44. Measurements of battery current are made with ammeter 42. Battery and individual cell temperatures are measured by temperature sensor(s) 46. Voltage, current and temperature measurements are processed with arithmetic circuit 50. Arithmetic circuit (estimator means) 50, takes in the measurements from the sensor components and perform the calculation methods of the present invention for power estimation. In some embodiments, temperature is not needed in the calculation methods.

1. Calculation Based on State-of-Charge (SOC) Limits

As shown in steps 10 and 20 of FIGS. 1A and 1B, embodiments of the present invention calculate the maximum charge/discharge current values using SOC limits. Various embodiments also have the explicit inclusion of a time horizon $\Delta t$ in the calculation. The SOC limits are included as follows. First, for a constant current $i_k$ the SOC recurrent relationship is described as:

$$z_k(t+\Delta t) = z_k(t) - (\eta_i \Delta t / C) i_k \quad (4)$$

where $z_k(t)$ is the present SOC for cell k, $z_k(t+\Delta t)$ is the predicted SOC $\Delta t$ seconds into the future, C is the cell capacity in ampere-seconds, and $\eta_i$ is the Coulombic efficiency factor at current level $i_k$. Here, for simplicity of presentation, it is assumed that $\eta_i = 1$ for discharge currents and $\eta_i = \eta \leq 1$ for charge currents.

If there are design limits on SOC such that $z_{min} \leq z_k(t) \leq z_{max}$ for all cells in the pack, then current $i_k$ can be computed such that these limits are not exceeded. Simple algebra gives limits based on the SOC of each cell:

$$i_{max,k}^{dis,soc} = \frac{z_k(t) - z_{min}}{\Delta t / C} \quad (5)$$

$$i_{min,k}^{chg,soc} = \frac{z_k(t) - z_{max}}{\eta \Delta t / C} \quad (6)$$

The pack maximum absolute currents—based only on cell SOC—are then $$i_{max}^{dis,soc} = \min_k \left( i_{max,k}^{dis,soc} \right)$$

$$i_{min}^{chg,soc} = \max_k \left( i_{min,k}^{chg,soc} \right)$$

This method assumes that there is a valid SOC estimate available for every cell in the pack. If this is not the case, then an approximate remedy would be to calculate $$i_{max}^{dis,soc} \approx \frac{z(t) - z_{min}}{\Delta t / C};$$

$$i_{min}^{chg,soc} \approx \frac{z(t) - z_{max}}{\eta \Delta t / C},$$

where $z(t)$ is the pack SOC.

In one embodiment of the present invention, the power predictive method can take into account more information than simply the cell SOC. For example, a Kalman filter can be used as a method to estimate all the cell SOCs in a pack.

Besides giving the SOC, Kalman filtering yields estimates of the uncertainty of the SOC estimate itself. A method of using Kalman filter to estimate SOC is described in commonly assigned U.S. Pat. No. 6,534,954, hereby incorporated by reference.

Let the uncertainty have Gaussian distribution with standard deviation, as estimated by the Kalman filter, be denoted as $\sigma_z$. Then, the method yields a 95.5% confidence that the true SOC is within the estimate $\pm 2\sigma_z$ and a 99.7% confidence that the true SOC is within the estimate $\pm 3\sigma_z$.

This information can be incorporated into the estimate of maximum current based on SOC to have very high confidence that SOC design limits will not be violated. This is done as (assuming a $\pm 3\sigma_z$ confidence interval):

$$i_{max,k}^{dis,soc} = \frac{(z_k(t) - 3\sigma_z) - z_{min}}{\Delta t/C}$$

$$i_{min,k}^{chg,soc} = \frac{(z_k(t) + 3\sigma_z) - z_{max}}{\eta \Delta t/C}$$

2. Calculation Based on Voltage Limits

Besides taking SOC limits into account, embodiments of the present invention correct a limitation in the prior art HPPC method for applying voltage limits (steps 12 and 22 of FIGS. 1A and 1B). In the HPPC method, if the cell model of equation (1) is assumed, and that $R^{chg}$ and $R^{dis}$ are the cell's Ohmic resistances, then equation (2) and equation (3) predict the instantaneously available current, not the constant value of current that is available for the next $\Delta t$ seconds. If cases where $\Delta t$ is large, the result of the calculation poses a safety or battery-health issue, as the cells may become over/under charged.

To overcome this problem, an embodiment of the present invention uses the following cell model:

$$v_k(t+\Delta t) = OCV(z_k(t+\Delta t)) - R \times i_k(t), \quad (7)$$

This modifies the previous cell model in equation (1). Note that this model cannot be directly solved in closed form for the maximum current $i_k$ since $z_k(t+\Delta t)$ is itself a function of current (cf. (4)) and OCV($\cdot$) is a nonlinear relationship. Note that other cell models can be used as well.

Two method embodiments are directed to solving (7) for the maximum absolute value of $i_k(t)$.

2.1 Method I: Taylor-Series Expansion

The first method uses a Taylor-series expansion to linearize the equation, so that an approximate value of i can be solved. It is assumed that OCV($\cdot$) is differentiable at point $z_k(t)$, which gives the result $$OCV(z_k(t+\Delta t)) = OVC\left(z_k(t) - i_k\frac{\eta_i \Delta t}{C}\right),$$

$$= OVC(z_k(t)) - i_k\left(\frac{\eta_i \Delta t}{C}\right)\frac{\partial OCV(z)}{\partial z}\bigg|_{z=z_k(t)}$$

$$+ R_1(z_k(t), i_k(\eta_i\Delta t)/C)$$

where the first-order residual $R_1(z_k(t), i_k(\leftarrow_i\Delta t)/C)/\|z_k(t)\| \to 0$ as $i_k(\eta_i+\Delta t)/C \to 0$ in $\mathfrak{R}$. Note that the change in SOC over $\Delta t$ seconds is generally small, so the following approximation may be applied $$OVC(z_k(t+\Delta t)) \approx OCV(z_k(t)) - i_k\frac{\eta_i \Delta t}{C}\frac{\partial OCV(z)}{\partial z}\bigg|_{z=z_k(t)}$$

$$- R \times i_k$$

which gives $$i_{max,k}^{dis,volt} = \left(\frac{OCV(z_k(t)) - v_{min}}{\frac{\Delta t}{C}\frac{\partial OCV(z)}{\partial z}\bigg|_{z_k(t)} + R^{dis}}\right) \quad (8)$$

$$i_{min,k}^{chg,volt} = \left(\frac{OCV(z_k(t)) - v_{max}}{\left(\frac{\eta \Delta t}{C}\frac{\partial OCV(z)}{\partial z}\right)\bigg|_{z_k(t)} + R^{chg}}\right) \quad (9)$$

In one embodiment, both the function OCV(z) and its derivative $\partial OCV(z)/\partial z$ might be computed from some known mathematical relationship for OCV(z), (e.g., Nemst's equation) using either analytic or numeric methods, or by a table lookup of empirical data. This quantity is positive for most battery electrochemistries over the entire SOC range, so the values computed by (8) and (9) are smaller in magnitude than those from (2) and (3) for the same values of $R^{dis}$ and $R^{chg}$.

The HPPC procedure compensates for its inaccuracy by using modified values of $R^{dis}$ and $R^{chg}$, determined experimentally, that approximate the denominator terms in (8) and (9). This can not be accurate over the entire SOC range, however, as $\partial OCV(z)/\partial z$ is not constant, particularly near extreme values of z.

Discharge and charge currents with all limits enforced are computed as (steps 16 and 26 of FIGS. 1A and 1B)

$$i_{max}^{dis} = \min\left(i_{max}, \min_k i_{max,k}^{dis,soc}, \min_k i_{max,k}^{dis,volt}\right) \quad (10)$$

$$i_{min}^{chg} = \max\left(i_{min}, \max_k i_{min,k}^{chg,soc}, \max_k i_{min,k}^{chg,volt}\right), \quad (11)$$

and power may be calculated using the sum of all cell powers. These are equal to the product of the maximum allowed current and the predicted future voltage.

$$P_{min}^{chg} = n_p \sum_{k=1}^{n_s} i_{min}^{chg} v_k(t+\Delta t) \quad (12)$$

$$\approx n_p \sum_{k=1}^{n_s} i_{min}^{chg}(OCV(z_k(t) - i_{min}^{chg}\eta_i\Delta t/C) - R^{chg} \times i_{min}^{chg}),$$

$$P_{max}^{dis} = n_p \sum_{k=1}^{n_s} i_{max}^{dis} v_k(t+\Delta t) \quad (13)$$

$$\approx n_p \sum_{k=1}^{n_s} i_{max}^{dis}(OCV(z_k(t) - i_{max}^{dis}\Delta t/C) - R^{dis} \times i_{max}^{dis}),$$

Maximum and minimum cell and pack power limits may also be imposed in this calculation. Note that in all equations, OCV(z), C, $v_{max}$, $v_{min}$, $z_{max}$, $z_{min}$, $i_{max}$, $i_{min}$, $R^{chg}$ and $R^{dis}$ may be functions of temperature and other factors pertaining to the present battery pack operating conditions.

2.1 Method II: Using a Comprehensive Cell Model

The method for solving (7) presented in the previous section requires less computational intensity. A second method embodiment of the present invention may be used when more computational power is available. This second method assumes a more precise mathematical model of cell dynamics, which might be in a discrete-time state-space form such as the coupled pair of equations $$x_k[m+1]=f(x_k[m],u_k[m])$$

$$v_k[m]=g(x_k[m], u_k[m])$$

where m is the discrete time sample index, the vector function of time $x_k[m]$ is called the "state" of the system, $u_k[m]$ is the input to the system, which includes cell current $i_k[m]$ as a component, and might also include temperature, resistance, capacity and so forth, and $f(\cdot)$ and $g(\cdot)$ are functions chosen to model the cell dynamics. Alternate model forms, including continuous-time state-space forms, differential or difference equations might also be used. It is assumed that there is a method to compute SOC given the model that is implemented.

For convenience of presentation, it is assumed that the cell model is in a discrete-time state-space form. Also assume that $\Delta t$ seconds may be represented in discrete time as T sample intervals. Then, this model can be used to predict cell voltage $\Delta t$ seconds into the future by $$v_k[m+T]=g(x_k[m+T],u_k[m+T]),$$

where $x_k[m+T]$ may be found by simulating (14) for T time samples. It is assumed that the input remains constant from time index m to m+T, so if temperature change (for example) over this interval is significant, it must be included as part of the dynamics modeled by (14) and not as a part of the measured input $u_k[m]$.

The method then uses a bisection search algorithm to find $i_{max,k}^{dis,volt}$ and $i_{min,K}^{chg,volt}$ by looking for the $i_k$ (as a member of the $u_k$ vector) that causes equality in $$v_{min}=g(x_k[m+T],u_k[m+T]),\ or$$

$$0=g(x_k[m+T],u_k[m+T])-v_{min}$$

to find $i_{max,k}^{dis,volt}$, and by looking for the $i_k$ that causes equality in $$v_{max}=g(x_k[m+T],u_k[m+T]),\ or$$

$$0=g(x_k[m+T],u_k[m+T])-v_{max}$$

to find $i_{min,k}^{chg,volt}$. A special case is when the state equation (14) is linear—that is, when $$x_k[m+1]=Ax_k[m]+Bu_k[m]$$

where A and B are constant matrices. The model presented in Section 3, entitled "An Example Cell Model," is an example where this is the case. Then, for input Uk constant time m to m+T, leading to $$x_k[m+T] = A^T x_k[m] + \left(\sum_{j=0}^{T-1} A^{T-1-j} B\right) u_k.$$

Most of these terms may be pre-computed without knowledge of $u_k$ in order to speed calculation using the bisection algorithm.

Once the SOC-based current limits $i_{max,k}^{dis,soc}$ and $i_{min,k}^{chg,soc}$ are computed using (5) and (6), and the voltage-based current limits $i_{max,k}^{dis,volt}$ and $i_{min,k}^{chg,volt}$ are computed using (16) and (17), overall current limits may be computed using (10) and (11) (steps 16 and 26 of FIGS. 1A and 1B). Power is then computed as $$P_{min}^{chg} = n_p \sum_{k=1}^{n_s} i_{min}^{chg} v_k(t+\Delta t)$$

$$= n_p \sum_{k=1}^{n_s} i_{min}^{chg} g_k(x_k(m+T), u_k),$$

with $u_k$ containing $i_{min}^{chg}$ as its value for current, and $$P_{max}^{dis} = n_p \sum_{k=1}^{n_s} i_{max}^{dis} v_k(t+\Delta t)$$

$$= n_p \sum_{k=1}^{n_s} i_{max}^{dis} g_k(x_k(m+T), u_k),$$

with $u_k$ containing $i_{min}^{dis}$ as its value for current.

2.2.1 Bisection Search

To solve (16) and (17), a method to solve for a root of a nonlinear equation is required. In one embodiment the bisection search algorithm is used for this requirement. The bisection search algorithm looks for a root of $f(x)$ (i.e., a value of x such that $f(x)=0$) where it is known a priori that the root lies between values $x_1<\text{root}<x_2$. One way of knowing that a root lies in this interval is that the sign of $f(x_1)$ is different from the sign of $f(x_2)$.

Each iteration of the bisection algorithm evaluates the function at the midpoint $X_{mid}=(x_1+x_2)/2$. Based on the sign of the evaluation, either $x_1$ or $x_2$ is replaced by $x_{mid}$ to retain different signs on $f(x_1)$ and $f(x_2)$. It is evident that the uncertainty in the location of the root is halved by this algorithmic step. The bisection algorithm repeats this iteration until the interval between $x_1$ and $x_2$, and hence the resolution of the root of $f(x)$ is as small as desired. If $\epsilon$ is the desired root resolution, then the algorithm will require at most $\lceil \log_2(|x_2-x_1|/\epsilon) \rceil$ iterations. The bisection method is listed in Listing 1.

2.2.2 Finding Maximum/Minimum Current

To determine maximum discharge and charge current for any particular cell, bisection is performed on (16) and (17). Bisection is incorporated in the overall algorithm as follows. First, three simulations are performed to determine cell voltages $\Delta t$ seconds into the future for cell current $i_k=0$, $i_k=i_{min}$, and $i_k=i_{max}$. If cell voltages are predicted to be between $v_{min}$ and $v_{max}$ for the maximum discharge rates, then these maximum rates may be used. If the cell voltages, even during rest, are outside of bounds, then set the maximum rates to zero. Otherwise, the true maximum rate may be found by bisecting between rate equal to zero and its maximum value. Bisection is performed between current limits $(i_{min},0)$ or $(0,i_{max})$.

---

Algorithm 1 The bisection algorithm.

begin {bisection algorithm}
    set $x_1$ = first search limit
    set $x_2$ = second search limit
    set $\epsilon$=desired resolution on current in bisection output
    set JMAX = maximum number of bisection iterations -continued Algorithm 1 The bisection algorithm.

$$\geq \left\lceil \log_2\left(\frac{|x_2 - x_1|}{\varepsilon}\right)\right\rceil$$

```
let func(·) be function in which to find root
set the search interval dx = x₂ - x₁
if (( func (x₁)≧0){// constraint: func(x₁) < 0
    dx = -dx
    x₁ = x₂
}// root is now between (x₁, x₁ + dx) and func (x₁) < 0
for j = 1 to JMAX{
    dx = 0.5 × dx
    x_mid = x₁ + dx
    if (func (x_mid) ≦ 0){x₁ = x_mid }
    if (|dx| ≦ ε) {return (x₁ + 0.5 × dx}
}// have bisected too many times, so return best guess
return(x₁ + 0.5 × dx)
end {bisection algorithm}
```

3. An Example Cell Model

An example cell model for the present invention power estimation methods is presented herein, with illustrations given to show the performance of the two methods compared to the prior art PNGV HPPC method. The cell model is a discrete-time state-space model of the form of (14) and (15) that applies to battery cells. The model, named "Enhanced Self-Correcting Cell Model," is further described in the article "Advances in EKF LiPB SOC Estimation," by the inventor, published in CD-ROM and presented in Proc. 20th Electric Vehicle Symposium (EVS20) in Long Beach, Calif., (November 2003) and is hereby fully incorporated by reference. It is understood this model is an example model only and that a variety of suitable alternate models can be used.

The "Enhanced Self-Correcting Cell Model" includes effects due to open-circuit-voltage, internal resistance, voltage time constants, and hysteresis. For the purpose of example, the parameter values are fitted to this model structure to model the dynamics of high-power Lithium-Ion Polymer Battery (LiPB) cells, although the structure and methods presented here are general.

State-of-charge is captured by one state of the model. This equation is $$z_k[m+1] = z_k[m] - (\eta_i \Delta T/C)i_k[m],$$

where $\Delta T$ represents the inter-sample period (in seconds), and C represents the cell capacity (in ampere-seconds).

The time-constants of the cell voltage response are captured by several filter states. If there is let to be $n_f$ time constants, then $$f_k[m+1] = A_f f_k[m] + B_f i_k[m]$$

The matrix $A_f \in \Re^{n_f \times n_f}$ may be a diagonal matrix with real-valued entries. If so, the system is stable if all entries have magnitude less than one. The vector $B_f \in \Re^{n_f \times 1}$ may simply be set to $n_f$ "1"s. The value of $n_f$ and the entries in the $A_f$ matrix are chosen as part of the system identification procedure to best fit the model parameters to measured cell data.

The hysteresis level is captured by a single state $$h_k[m+1] = $$

$$\exp\left(-\left|\frac{n_i i_k[m]\gamma\Delta T}{C}\right|\right)h_k[m] + \left(1 - \exp\left(-\left|\frac{n_i i_k[m]\gamma\Delta T}{C}\right|\right)\right)\text{sgn}(i_k[m])$$

where $\gamma$ is the hysteresis rate constant, again found by system identification.

The overall model state is $$x_k[m] = [f_k[m]' h_k[m] z_k[m]]'$$

where the prime symbol (') is the matrix/vector transpose operator. The state equation for the model is formed by combining all of the individual equations, above. Note, that at each time step, the state equation is linear in the input $$u_k[m] = [i_k[m] 1]',$$

which speeds the prediction operation.

The output equation that combines the state values to predict cell voltage is $$v_k[m] = OCV(z_k[m]) + Gf_k[m] - Ri_k[m] + Mh_k[m]$$

where $G \in \Re^{1 \times n_f}$ is a vector of constants that blend the time-constant states together in the output, R is the cell resistance (different values may be used for discharge), and M is the maximum hysteresis level.

Figure 3:
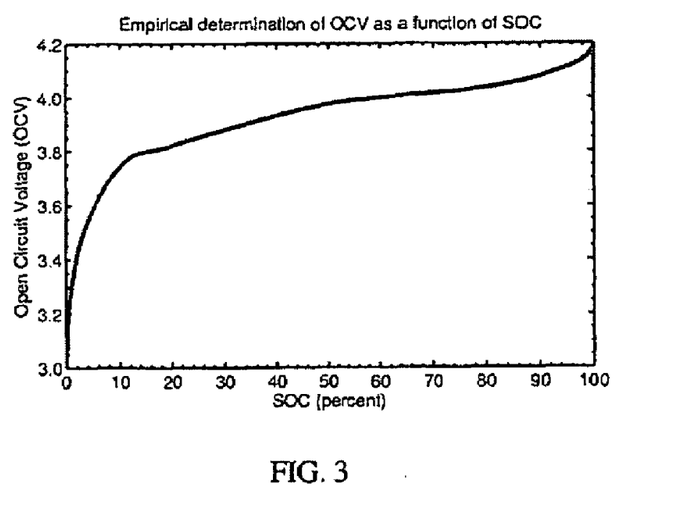
FIG. 3 is an example plot of open-circuit-voltage (OCV) as a function of state-of-charge for a particular cell electrochemistry.

The open-circuit-voltage as a function of state-of-charge for example Lithium Ion Polymer Battery (LiPB) cells is plotted in FIG. 3. This is an empirical relationship found by cell testing. First, the cell was fully charged (constant current to 4.2V, constant voltage to 200 mA). Then, the cell was discharged at the C/25 rate until fully discharged (3.0V). The cell was then charged at the C/25 rate until the voltage was 4.2V. The low rates were used to minimize the dynamics excited in the cells. The cell voltage as a function of state of charge under discharge and under charge were averaged to compute the OCV. This has the effect of eliminating to the greatest extent possible the presence of hysteresis and ohmic resistance in the final function. For the purpose of computations involving OCV, the final curve was digitized at 200 points and stored in a table. Linear interpolation is used to look up values in the table.

Figure 4:
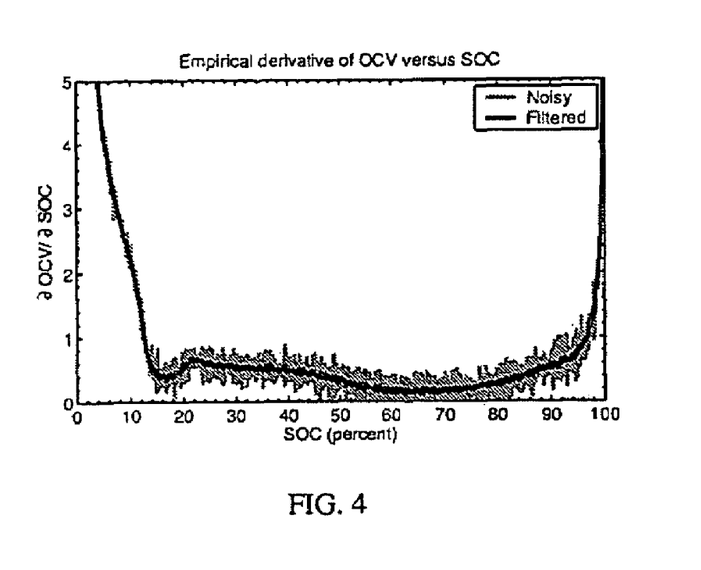
FIG. 4 is an example plot showing the derivative of OCV as a function of state-of-charge for a particular cell electrochemistry.

The partial derivative of OCV with respect to SOC for these example cells is plotted in FIG. 4. This relationship was computed by first taking finite differences between points in the OCV plot in FIG. 3 and dividing by the distance between points (i.e., Euler's approximation to a derivative). The resulting data is too noisy to be of practical use, as shown in the gray line of FIG. 4. It was filtered using a zero-phase low-pass filter, resulting in the black line of FIG. 4, which may be used in the power calculation. This relationship is also digitized at 200 points, and linear interpolation into the table of values is used when computations requiring this function are performed.

Figure 5:
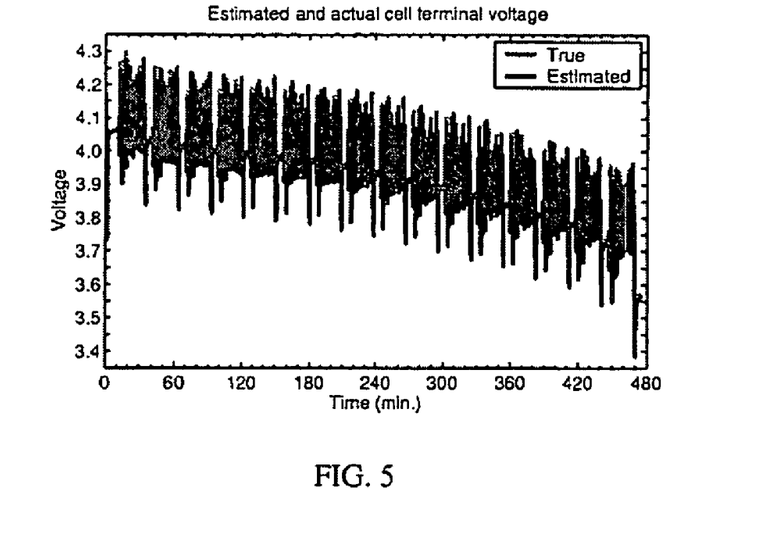
FIG. 5 is a plot showing the voltage prediction using the cell model of the present invention.
Figure 6:
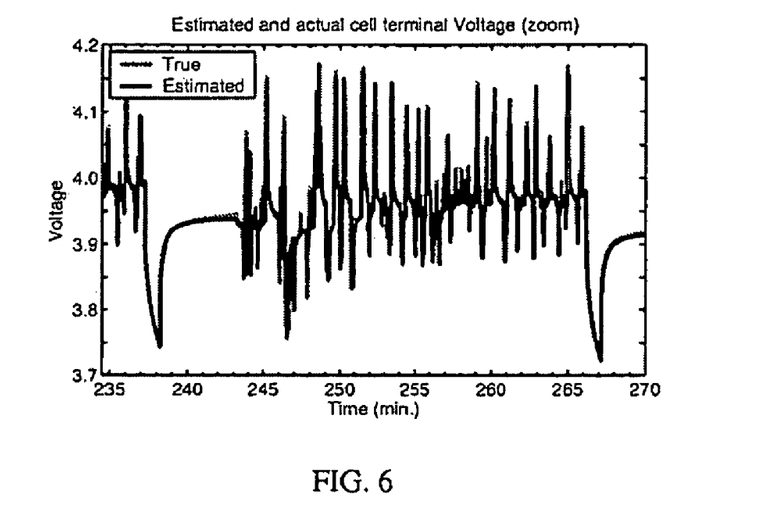
FIG. 6 is a zoom-in of the plot of voltage prediction for one UDDS cycle at around 50% state-of-charge.
Figure 7:
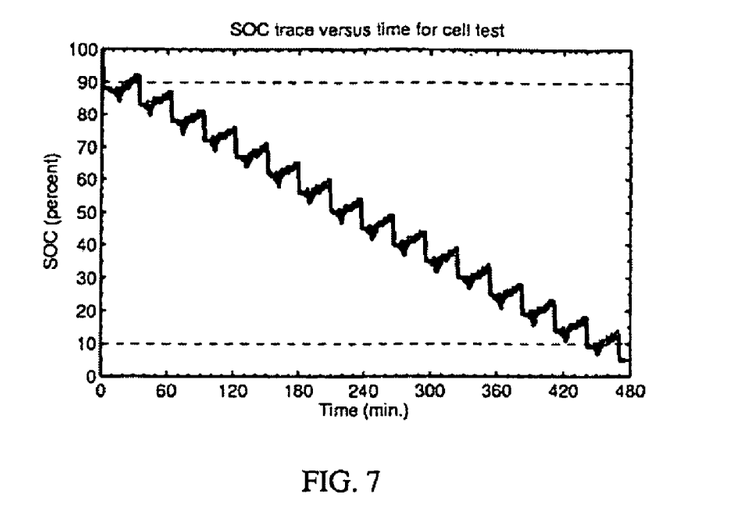
FIG. 7 is a state-of-charge trace for cell test.

Other parameters are fit to the cell model. In particular, the model employs four low-pass filter states ($n_f$=4), a nominal capacity of 7.5 Ah, and an inter-sample interval of $\Delta T$=1s. There is very close agreement between the cell model voltage prediction and the cell true voltage. This is illustrated in FIG. 5, which is a plot showing the voltage prediction using the cell model of the present invention. For this figure, the cell test was a sequence of sixteen UDDS cycles, performed at room temperature, separated by discharge pulses and five-minute rests, and spread over the 90% to 10% SOC range. The difference between true cell terminal voltage and estimated cell terminal voltage is very small (a root-mean-squared (RMS) voltage estimation error of less than 5 mV). To better illustrate the model's fidelity, refer to the zoom on one UDDS cycle in the 50% SOC region, shown in FIG. 6. The SOC as a function of time is plotted in FIG. 7, which is a SOC trace for cell test. The graph shows that SOC increases by about 5% during each UDDS cycle, but is brought down about 10% during each discharge between cycles. The entire operating range for these cells (10% SOC to 90% SOC, delineated on the figure as the region between the thin dashed lines) is excited during the cell test.

4. Comparing Maximum Power Calculations

The PNGV HPPC power estimation method gives a result that is a function of only SOC. Therefore, it is possible to graph available power versus SOC to summarize the algorithm calculations. The first method proposed (Method I: Taylor Series Expansion Method) in this patent disclosure is also possible to display in this way. Estimated power is only a function of SOC, $\partial OCV/\partial z$ (also a function of SOC), and static limits on maximum current and power. The second method (Method II: the Comprehensive Cell Model Method), however, dynamically depends on all states of the system. Two systems at the same state of charge, but with different voltage time-constant state values or hysteresis state levels will have different amounts of power available. To compare power computed by the three methods, dynamic tests must be conducted.

For the following results, a pack of LiPB cells is assumed to be with $n_s$=40 and $n_p$=1. The data to fit the models was collected from prototype hand-made cells jointly developed by LG Chem (Daejeon, Korea) and Compact Power Inc. (Monument, Colo.). Limits for the power calculations are listed in Table 1. Each cell has a nominal capacity of 7.5 Ah, and $\Delta t$ was ten seconds for both charge and discharge.

TABLE 1

Parameters for power calculation examples.

| Parameter | Minimum | Maximum |
|---|---|---|
| $v_k(t)$ | 3.0 V | 4.35 V |
| $i_k(t)$ | −200 A | 200 A |
| $z_k(t)$ | 0.1 | 0.9 |
| $p_k(t)$ | −∞ | ∞ |

Figure 8:
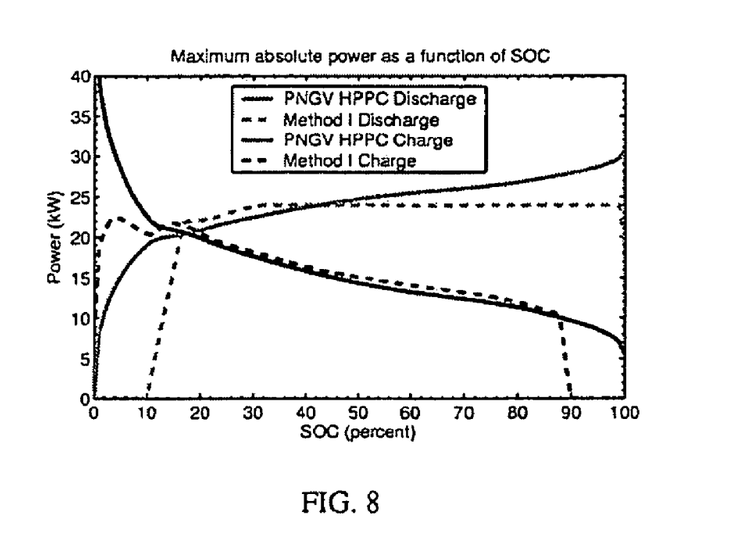
FIG. 8 is a plot comparing static maximum power calculations as functions of SOC for the PNGV HPPC method and Method I of the present invention.

First, the PNGV HPPC method and Method I of the present invention are compared in FIG. 8, which is a plot comparing static maximum power calculations as functions of SOC for the PNGV HPPC method and Method I of the present invention. The black curves correspond to charge power, and the gray curves correspond to discharge power. Note that the absolute value of power is plotted to avoid confusion due to sign conventions. Considering first the calculations of charge power, it is evident that the PNGV HPPC method produces similar values to Method I in the mid-SOC range. The slight differences are due to the fact that the 10-second $R^{chg}$ value used for the PNGV method and the derivative-modified $R^{chg}$ for Method I are not identical. Outside the mid-SOC range, the graph shows that Method I ramps power down in the neighborhood of $z_{max}$ to avoid over-charging the cell, whereas the PNGV method has no such limit. At very low SOCs, the PNGV method over-predicts how much power is available since there are no current limits applied to the calculation. The Method I estimate is automatically lower due to the large derivative in the denominator of the calculation. This causes an anomaly near zero SOC where the method under-predicts the available charge power. However, since the cell will not be operated in this range, this is not a concern.

Considering now the discharge power curves, the comparison shows that Method I imposes limits on discharge power to ensure that the cell is not under-charged, whereas the PNGV method does not. In the SOC range from about 15% to 35%, the two methods predict similar powers. For SOC above about 35%, the power predicted by Method I saturates because the maximum discharge current limit of 200 A has been reached. The PNGV method does not consider this limit. At SOC around 99% the graph again shows an anomaly in the Method I calculation where power is under-estimated due to the large derivative term. This apparent glitch is not a problem since the cell will not be operated in this range.

Figure 9:
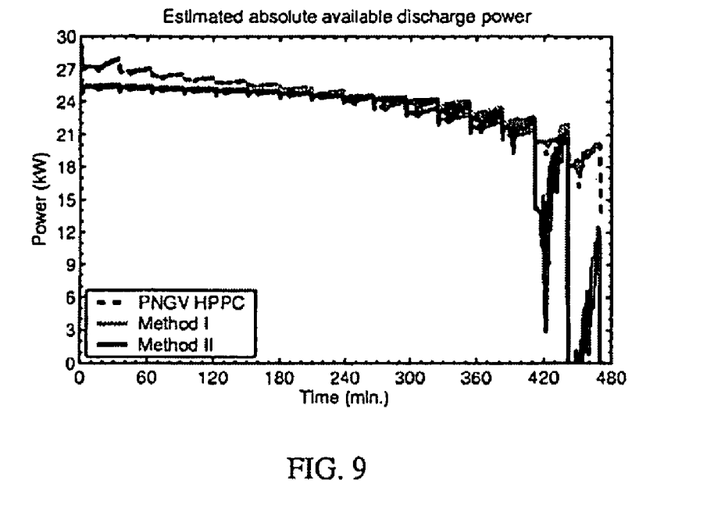
FIG. 9 is a plot showing that discharge power capability estimates for cell cycle test comprising sixteen UDDS cycles over an SOC range of 90% down to 10%.
Figure 10:
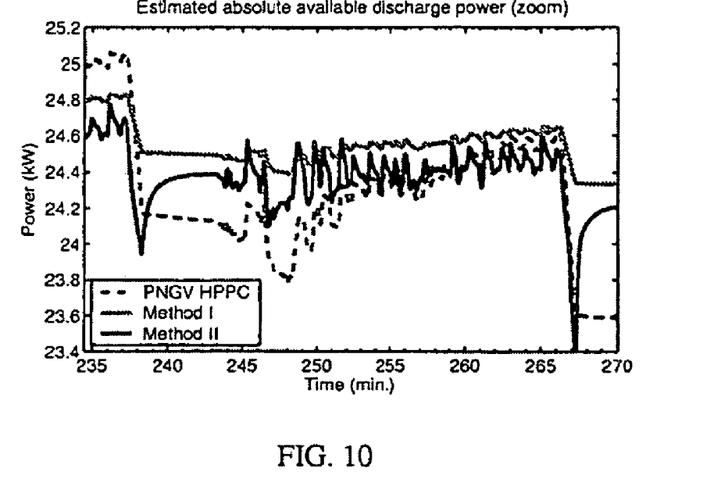
FIG. 10 is zoomed-in plot of FIG. 9, showing about one UDDS cycle.
Figure 11:
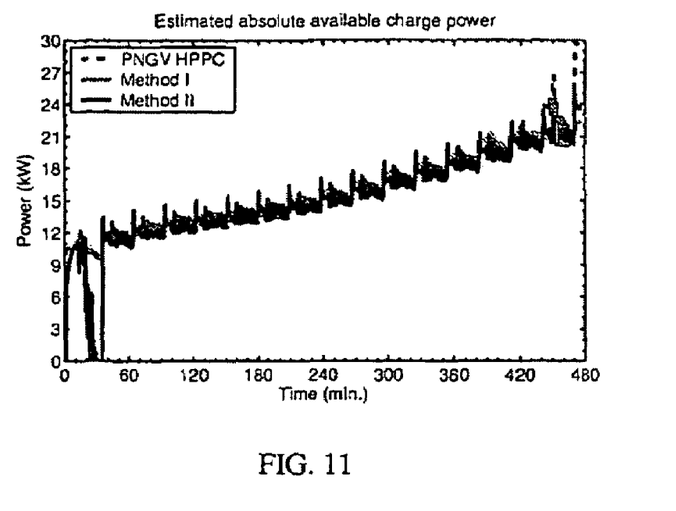
FIG. 11 is a plot showing charging power capability estimates for cell cycle test comprising sixteen UDDS cycles over an SOC range of 90% down to 10%.
Figure 12:
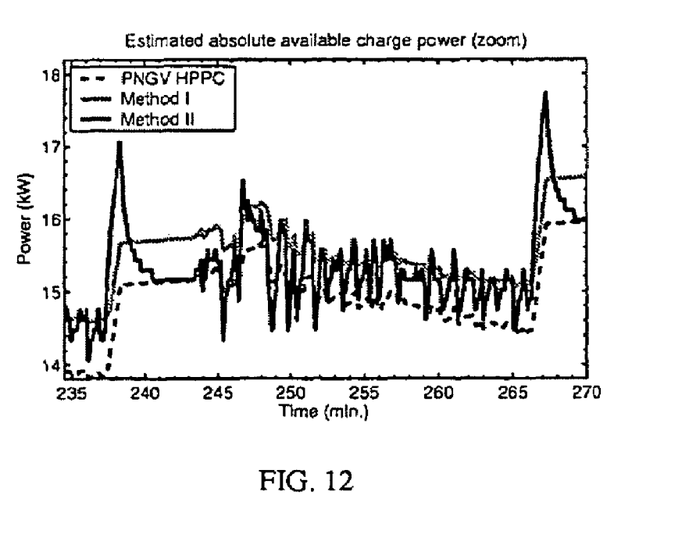
FIG. 12 is zoomed-in plot of FIG. 11, showing about one UDDS cycle.

FIGS. 9 through 13 show how the two main voltage-limit based methods of power estimation of the present invention (Method I and Method II) compare to the prior art PNGV method in the dynamic cell tests shown in FIG. 5. FIG. 9 is a plot showing that discharge power capability estimates for cell cycle test comprising sixteen UDDS cycles over an SOC range of 90% down to 10%. FIG. 10 is zoomed-in plot of FIG. 9, showing about one UDDS cycle. FIG. 11 is a plot showing charging power capability estimates for cell cycle test comprising sixteen UDDS cycles over an SOC range of 90% down to 10%. FIG. 12 is zoomed-in plot of FIG. 11, showing about one UDDS cycle. Again, the absolute value of power is plotted.

In the discussion that follows, the results of Method II are considered to be the "true" capability of the cell. This assumption is justified by the fidelity of the cell model's voltage estimates, as supported by the data in FIG. 6. FIG. 9 shows that the three methods produce similar estimates. In particular, Methods I and II appear to be nearly identical when viewed at this scale. At high SOCs, the PNGV HPPC method predicts higher power than is actually available (by as much as 9.8%), and at low SOCs the PNGV HPPC method under-predicts the available power. Only the methods of the present invention include SOC bounds, which explain why their predictions are so different from the PNGV HPPC estimates at low SOC. If the vehicle controller were to discharge at the rates predicted by the PNGV HPPC method, the cell would be over-discharged in some cases (lowering its lifetime), and under-utilized in other cases. FIG. 10 zooms in on FIG. 9 (same region shown as in FIG. 6) to show greater detail. In this region, the three methods produce nearly identical predictions. A notable feature of Method II, however, is that it takes into account the entire dynamics of the cell when making a prediction. Therefore, the strong discharges at around time 237 and 267 minutes draw the cell voltage down, and allows less discharge power than the other two methods which only consider SOC when making their estimate.

The three methods are also compared with respect to charge power, shown in FIG. 11. At this scale, the estimates appear nearly identical. Again, the PNGV HPPC method does not consider SOC limits, so over-predicts charge power at high SOCs. It also over-predicts power at low SOCs as it ignores the increase to charge resistance at low SOC. A zoom of this plot is shown in FIG. 12, which accentuates the differences between the predictions. Here, it can be seen that the strong discharges at around time 237 and 267 minutes allow for greater charging power, as the voltage will not quickly change.

5. Conclusion

While the methods described herein, and the apparatus for carrying these methods into effect, constitute preferred embodiments of the present invention, it should be recognized that changes may be made therein without departing from the spirit or scope of the present invention, which is defined in the appended claims. For example, the steps 10, 12, 14 disclosed in FIG. 1A can be executed in different orders or used in different combinations and steps 20, 22, 24 disclosed in FIG. 1B can be executed in different orders or used in different combinations. Also, various cell models can be substituted for the purpose of estimating the maximum absolute charge/discharge power of a battery/battery cell.

A method and apparatus for the calculation of power capability of battery packs using advanced cell model predictive techniques has been described in conjunction with one or more specific embodiments. The invention is defined by the following claims and their full scope of equivalents.

I claim:

1. A method for estimating a maximum discharge power of a battery, comprising:

generating a signal indicative of a present state-of-charge of said battery, utilizing a sensor;

calculating said present state-of-charge of said battery based on said signal, utilizing an arithmetic circuit operably coupled to said sensor;

calculating a maximum discharge current of said battery utilizing said arithmetic circuit based on at least a minimum state-of-charge limit associated with said battery, said present state-of-charge of said battery, and a minimum voltage limit associated with said battery such that a future output voltage of said battery does not fall below said minimum voltage limit and a future state-of-charge of said battery does not fall below said minimum state-of-charge limit associated with said battery; and, calculating said maximum discharge power based on said maximum discharge current value, utilizing said arithmetic circuit, wherein said calculating said maximum discharge current is also based on a maximum current limit associated with said battery.

2. The method of claim 1, further comprising calculating said present state-of-charge of said battery using a Kalman filtering method.

3. The method of claim 1, wherein said battery is a battery pack comprising at least one cell.

4. The method of claim 1, wherein said calculated maximum discharge power is checked to ensure that it falls within power limits of said battery.

5. A system for estimating a maximum discharge power of a battery, comprising:

a sensor configured to generate a signal indicative of a present state-of-charge of said battery; and an arithmetic circuit operably coupled to said sensor, said arithmetic circuit configured to calculate said present state-of-charge of said battery based on said signal, the arithmetic circuit further configured to calculate a maximum discharge current of said battery based on at least a minimum state-of-charge limit associated with said battery, said present state-of-charge of said battery, and a minimum voltage limit associated with said battery such that a future output voltage of said battery does not fall below said minimum voltage limit and a future state-of-charge of said battery does not fall below said minimum state-of-charge limit, said arithmetic circuit further configured to calculate said maximum discharge power based on said maximum discharge current value, wherein said calculating said maximum discharge current is also based on a maximum current limit associated with said battery.

* * * * *